United States Patent
Li et al.

(10) Patent No.: US 10,861,766 B1
(45) Date of Patent: Dec. 8, 2020

(54) PACKAGE STRUCTURES

(71) Applicant: Delta Electronics, Inc., Taoyuan (TW)

(72) Inventors: Jen-Chih Li, Taoyuan (TW);
Chang-Jing Yang, Taoyuan (TW);
Liang-Cheng Wang, Taoyuan (TW);
Shih-Yu Yeh, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 0 days.

(21) Appl. No.: 16/574,478

(22) Filed: Sep. 18, 2019

(51) Int. Cl.
*H01L 23/34* (2006.01)
*H01L 23/367* (2006.01)
*H01L 23/00* (2006.01)
*H01L 23/373* (2006.01)
*H01L 23/31* (2006.01)

(52) U.S. Cl.
CPC ...... *H01L 23/3675* (2013.01); *H01L 23/3157* (2013.01); *H01L 23/3736* (2013.01); *H01L 24/08* (2013.01)

(58) Field of Classification Search
CPC ............ H01L 23/3157; H01L 23/3675; H01L 23/3736; H01L 24/08; H01L 33/30; H01L 33/32; H01L 33/387

USPC .................................................... 257/88, 713
See application file for complete search history.

(56) References Cited

U.S. PATENT DOCUMENTS

2014/0210687 A1* 7/2014 Chiu .................... H01Q 1/2283
343/872
2018/0277512 A1* 9/2018 Waidhas ............. H01L 21/4853

* cited by examiner

*Primary Examiner* — Brook Kebede
(74) *Attorney, Agent, or Firm* — Muncy, Geissler, Olds & Lowe, P.C.

(57) ABSTRACT

A package structure is provided. The package structure includes a substrate, a plurality of active components, a plurality of separated metal parts and an encapsulation material. The substrate has a first surface and a second surface. Each active component has a first surface and a second surface. Each metal part has a first surface and a second surface. The first surface of each active component is connected to the first surface of the substrate. The first surface of one metal part is connected to the second surface of one active component. Each metal part extends to connect to the first surface of the substrate. The encapsulation material covers the first surface of the substrate and surrounds the active components and the metal parts. The second surface of each metal part and the second surface of the substrate are exposed from the encapsulation material.

20 Claims, 5 Drawing Sheets

PACKAGE STRUCTURES

BACKGROUND OF THE INVENTION

Field of the Invention

The invention relates to a package structure, and more particularly to a package structure having double-sided heat dissipation.

Description of the Related Art

A system-in-package (SIP) is a functional electronic system that includes two or more heterogeneous semiconductor dies (often from different technology nodes optimized for their individual functionalities), usually with, for example, active components, passive components and drive IC. The physical form of SIP is a module, depending on the final application, the module could include a logic chip, a memory chip, integrated passive devices (IPD), RF filters, sensors, heat sinks, antennas, connectors and/or a power chip in the package.

In a conventional system-in-package (SIP), the active components are connected to the electrodes of the substrate by a wire bonding process. The heat conduction towards the substrate is limited by the thickness and area of the copper layers on the printed circuit board (PCB) underneath. Due to the long heat dissipation path of the metal wires and considering the requirements of the number of wires and the wire spacing, the package structure that is formed is large in size and has the disadvantages of high overall inductance and large power loss.

Therefore, development of a small-size package structure with improved heat dissipation is desirable.

BRIEF SUMMARY OF THE INVENTION

In accordance with one embodiment of the invention, a package structure is provided. The package structure includes a substrate, a plurality of active components, a plurality of separated metal parts and an encapsulation material. The substrate has a first surface and a second surface opposite the first surface. Each active component has a first surface and a second surface opposite the first surface. Each metal part has a first surface and a second surface opposite the first surface. The first surface of each active component is connected to the first surface of the substrate. The first surface of one metal part is connected to the second surface of one active component. Each metal part extends to connect to the first surface of the substrate. The encapsulation material covers the first surface of the substrate and surrounds the active components and the metal parts. The second surface of each metal part and the second surface of the substrate are exposed from the encapsulation material.

In some embodiments, the substrate includes multiple circuit layers. In some embodiments, the active components include gallium nitride (GaN) active components. In some embodiments, the metal part includes copper, iron or aluminum.

In some embodiments, each active component further includes a plurality of electrodes disposed on the first surface of the active component. In some embodiments, the substrate further includes a plurality of electrodes disposed on the first surface of the substrate. In some embodiments, the electrodes of each active component are respectively connected to the electrodes of the substrate.

In some embodiments, the electrode of the active component is shaped like a cylinder or sphere. In some embodiments, the electrode of the active component is made of copper, solder, gold or nickel. In some embodiments, the adjacent electrodes of each active component have a spacing which is greater than or equal to 70 μm. In some embodiments, the electrode of the active component has a height which is greater than or equal to 40 μm. In some embodiments, the electrode of the active component has a diameter which is greater than or equal to 90 μm.

In some embodiments, each metal part includes a main portion and at least one extending portion connected to the main portion. The main portion is disposed on the second surface of the active component. The extending portion is connected to the electrode of the substrate.

In some embodiments, the package structure further includes at least one passive component disposed on the first surface of the substrate and connected to the electrode of the substrate. In some embodiments, the package structure further includes a drive integrated circuit disposed on the first surface of the substrate and connected to the electrode of the substrate.

In some embodiments, the package structure further includes a metal pad disposed on the second surface of the substrate and located at a position corresponding to the active components. In some embodiments, the metal pad includes three connection ports for connecting to external circuits. In some embodiments, the metal pad includes solder, aluminum, silver, gold or copper. In some embodiments, the package structure is connected to a printed circuit board by the metal pad. In some embodiments, the package structure has a thickness which is less than or equal to 3 mm.

The present invention uses flip chip technology to attach the reverse active components to the substrate. Since the electrodes of the active components are directly connected to the electrodes of the substrate instead of the conventional wire bonding process, the heat dissipation path is shortened and the inductance is lowered, further reducing conduction loss and switching loss. Due to the elimination of the wire bonding process, the active components occupy a relatively-small area of the substrate, which is suitable for miniaturization. In addition to the flip chip technology which promotes heat dissipation towards the substrate, the metal parts disposed on the opposite side of the electrodes of the active components also provides another heat dissipation path so that the present package structure achieves an effect of double-sided heat dissipation. Since the electrodes of the active components have an appropriate height (greater than or equal to about 40 μm), a suitable space is created between the active components and the substrate for improving the active components to endure high breakdown voltage and facilitating the mold flowing of the encapsulation material. Furthermore, the electrode (pad) (similar to T shape) disposed on the backside of the substrate includes three connection ports for connecting to external circuits. In addition to increasing flexibilities of circuit design, it also increases heat dissipation and reduces inductance. Since a number of integrated circuit components, for example, at least two active components, at least one passive component and one drive integrated circuit, are enclosed in the same package unit, the present package structure is regarded as a system in package (SIP).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
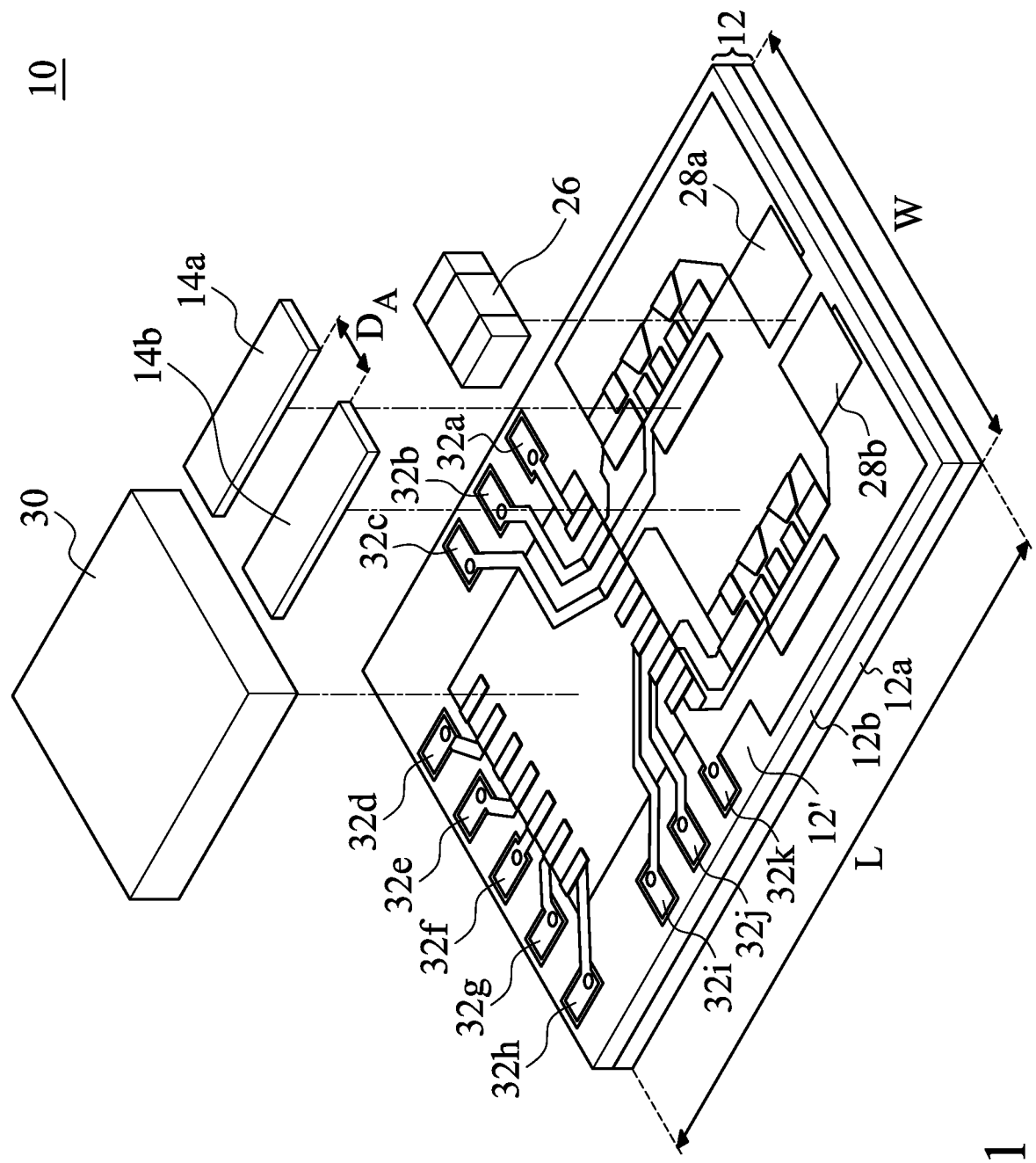
FIG. 1 is an exploded view of a package structure in accordance with one embodiment of the invention.
Figure 2:
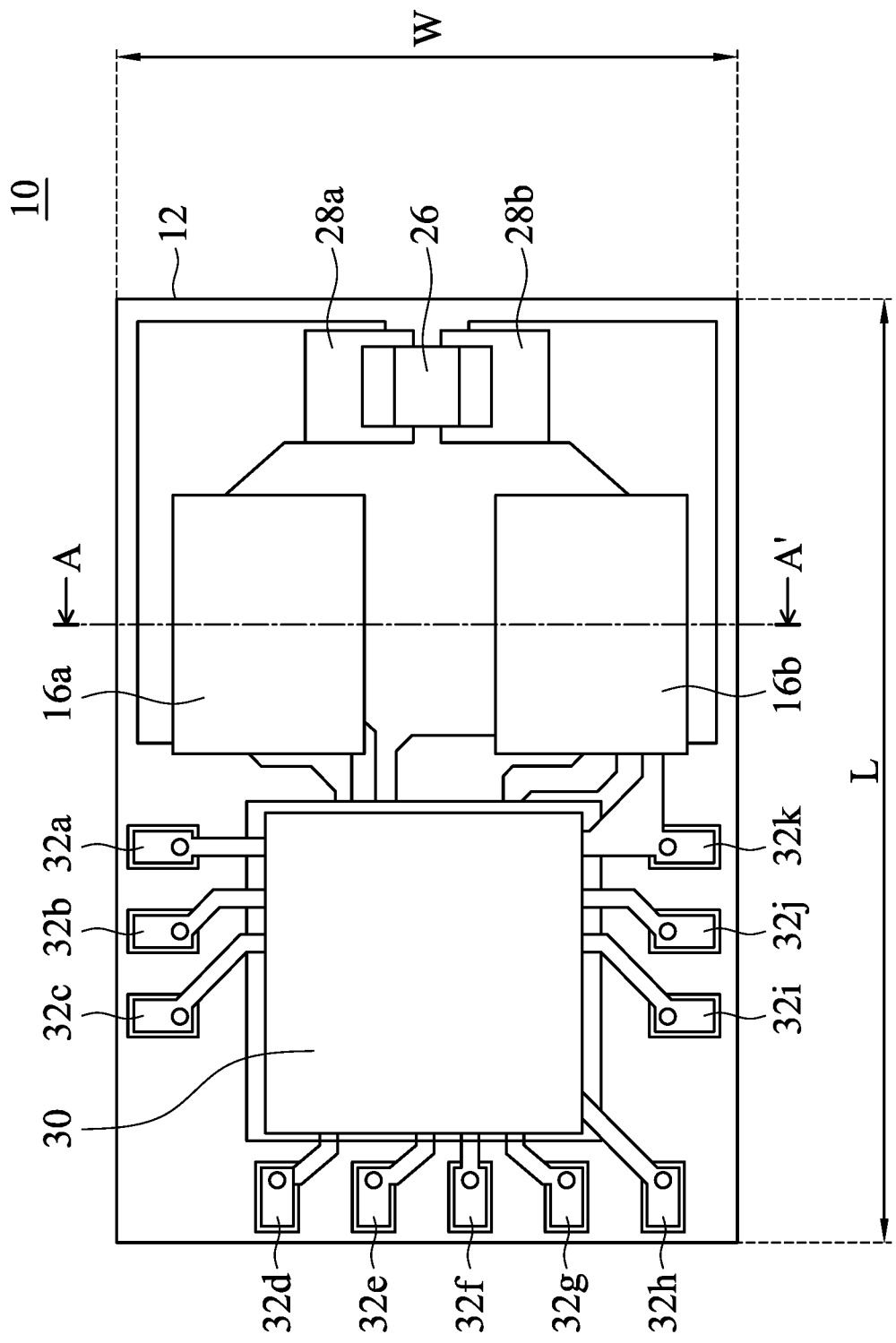
FIG. 2 is a top view of a package structure in accordance with one embodiment of the invention.
Figure 3:
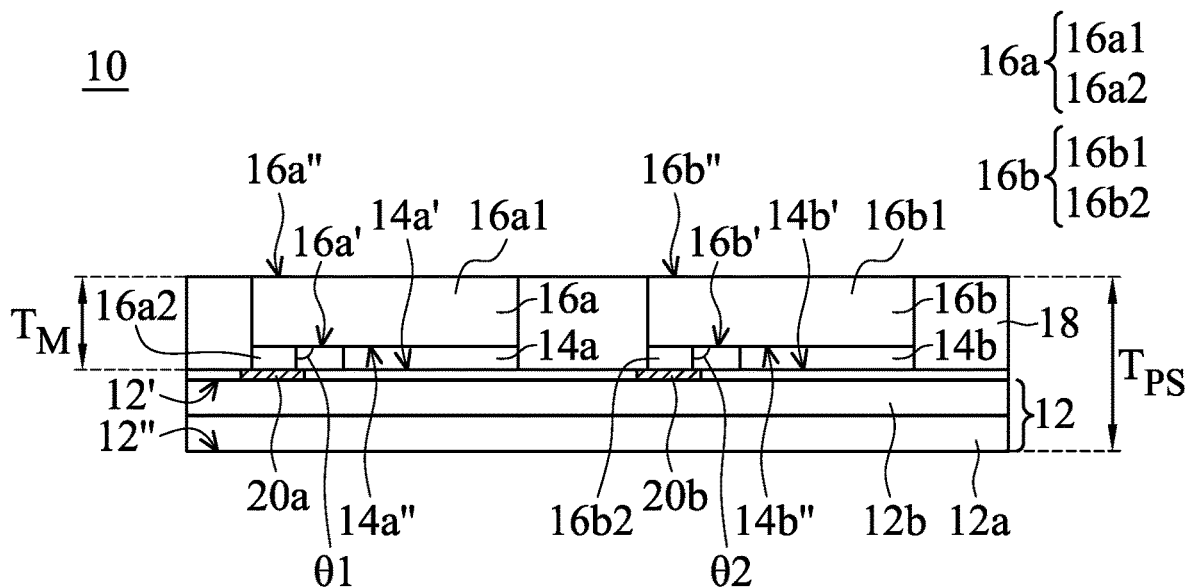
FIG. 3 is a cross-sectional view of a package structure in accordance with one embodiment of the invention.

Referring to FIGS. 1, 2 and 3, in accordance with one embodiment of the invention, a package structure 10 is provided. FIG. 1 is an exploded view of the package structure 10. FIG. 2 is a top view of the package structure 10. FIG. 3 is a cross-sectional view of the package structure 10, taken along a cross-sectional line A-A' of FIG. 2.

As shown in FIGS. 1, 2 and 3, the package structure 10 includes a substrate 12, a first active component 14a, a second active component 14b, a first metal part 16a, a second metal part 16b and an encapsulation material 18. The substrate 12 has a first surface 12' and a second surface 12" opposite the first surface 12'. The first active component 14a has a first surface 14a' and a second surface 14a" opposite the first surface 14a'. The second active component 14b has a first surface 14b' and a second surface 14b" opposite the first surface 14b'. The first metal part 16a has a first surface 16a' and a second surface 16a" opposite the first surface 16a'. The second metal part 16b has a first surface 16b' and a second surface 16b" opposite the first surface 16b'. The first surface 14a' of the first active component 14a and the first surface 14b' of the second active component 14b are respectively connected to the first surface 12' of the substrate 12. The first surface 16a' of the first metal part 16a is connected to the second surface 14a" of the first active component 14a. The first surface 16b' of the second metal part 16b is connected to the second surface 14b" of the second active component 14b. The first metal part 16a and the second metal part 16b respectively extend to connect to the first surface 12' of the substrate 12. The encapsulation material 18 covers the first surface 12' of the substrate 12 and surrounds the first active component 14a, the second active component 14b, the first metal part 16a and the second metal part 16b. The second surface 16a" of the first metal part 16a, the second surface 16b" of the second metal part 16b, and the second surface 12" of the substrate 12 are exposed from the encapsulation material 18.

In some embodiments, the substrate 12 includes multiple circuit layers (i.e. at least two circuit layers). For example, as shown in FIG. 3, the substrate 12 includes two circuit layers, that is, a first circuit layer 12a and a second circuit layer 12b. The second circuit layer 12b is disposed on the first circuit layer 12a. In accordance with the requirements of the products, other appropriate numbers of circuit layers, for example, three circuit layers or four circuit layers or more, are also applicable in the present invention. Various circuit layers provide different functions. For example, as shown in FIG. 3, the second circuit layer 12b provides a specific circuit layout for the components disposed thereon. The first circuit layer 12a facilitates the connection between the package structure 10 and the underlying PCB.

In some embodiments, the first active component 14a and the second active component 14b include, for example, gallium nitride (GaN) active components. In some embodiments, the active components with other appropriate materials, for example, silicon carbide (SiC), are also applicable in the present invention. In some embodiments, the first active component 14a and the second active component 14b include lateral power components, for example, lateral high-power components.

In some embodiments, the first metal part 16a and the second metal part 16b include, for example, copper, iron or aluminum. In some embodiments, other appropriate heat-dissipation metal materials are also applicable in the present invention. In FIG. 3, the first metal part 16a includes a main portion 16a1 and an extending portion 16a2 connected to the main portion 16a1. The main portion 16a1 is disposed on the second surface 14a" of the first active component 14a. The extending portion 16a2 is connected to the electrode 20a of the substrate 12. Also, the second metal part 16b includes a main portion 16b1 and an extending portion 16b2 connected to the main portion 16b1. The main portion 16b1 is disposed on the second surface 14b" of the second active component 14b. The extending portion 16b2 is connected to the electrode 20b of the substrate 12. In some embodiments, the number of the extending portion of the metal part is not limited thereto, and other appropriate numbers of the extending portions of the metal part are also applicable in the present invention. In some embodiments, in the first metal part 16a, the main portion 16a1 and the extending portion 16a2 have a first included angle "θ1" which is in a range from about 85 degrees to about 145 degrees therebetween. In some embodiments, the first included angle "θ1" between the main portion 16a1 and the extending portion 16a2 of the first metal part 16a is close to 90 degrees. In some embodiments, in the second metal part 16b, the main portion 16b1 and the extending portion 16b2 have a second included angle "θ2" which is in a range from about 85 degrees to about 145 degrees therebetween. In some embodiments, the second included angle "θ2" between the main portion 16b1 and the extending portion 16b2 of the second metal part 16b is close to 90 degrees. In some embodiments, the first included angle "θ1" and the second included angle "θ2" are the same or different. In some embodiments, the first metal part 16a and the second metal part 16b have a thickness "$T_M$" which is in a range from about 500 μm to about 800 μm. In some embodiments, other appropriate dimensions of the thickness "$T_M$" of the first metal part 16a and the second metal part 16b are also applicable in the present invention. As shown in FIG. 3, the first metal part 16a is separated from the second metal part 16b, that is, one metal part corresponds to (attached on) one active component, for example, the first metal part 16a corresponds to (attached on) the first active component 14a, and the second metal part 16b corresponds to (attached on) the second active component 14b.

Figure 4:
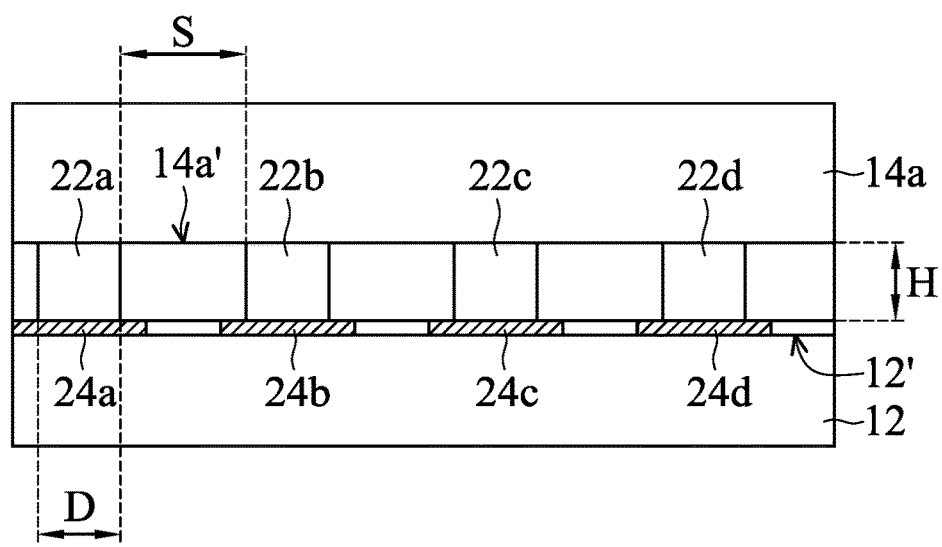
FIG. 4 is a cross-sectional view of a part of a package structure in accordance with one embodiment of the invention.

The detailed connection profile between the first and second active components (14a and 14b) and the substrate 12 is revealed. The connection profile between the first active component 14a and the substrate 12 is exemplary, as shown in FIG. 4. FIG. 4 is a cross-sectional view of a part of the package structure 10. The first active component 14a includes a plurality of electrodes (for example, 22a, 22b, 22c and 22d) disposed on the first surface 14a' of the first active component 14a. In some embodiments, the electrodes (for example, 22a, 22b, 22c and 22d) include a source electrode, a drain electrode, a gate electrode or an auxiliary electrode. In some embodiments, the number of the electrodes is not limited thereto, and other appropriate numbers of the electrodes of the first active component 14a are also applicable in the present invention. In some embodiments, the electrodes are arranged in an array (not shown) or around the peripheral area of the first active component 14a. In FIG. 4, the electrodes (for example, 22a, 22b, 22c and 22d) are laterally disposed on the first surface 14a' of the first active component 14a (i.e. disposition on the same plane). Therefore, the first active component 14a is a lateral power component. The substrate 12 includes a plurality of electrodes (pads) (for example, 24a, 24b, 24c and 24d) disposed on the first surface 12' of the substrate 12 and having different electric potential, for example, high or low electric potential. In FIG. 4, the electrodes (for example, 22a, 22b, 22c and 22d) of the first active component 14a are directly connected to the respective electrodes (pads) (for example, 24a, 24b, 24c and 24d) of the substrate 12, that is, the present invention uses flip chip technology to attach the reverse first active component 14a to the substrate 12. The electrodes (for example, 22a, 22b, 22c and 22d) of the first active component 14a are connected to the corresponding electrodes (pads) (for example, 24a, 24b, 24c and 24d) of the substrate 12.

In FIG. 4, the electrodes (for example, 22a, 22b, 22c and 22d) of the first active component 14a have a shape of cylinder. In some embodiments, the electrodes (for example, 22a, 22b, 22c and 22d) being another appropriate shape, such as the shape of sphere, is also applicable in the present invention. In some embodiments, the electrodes (for example, 22a, 22b, 22c and 22d) of the first active component 14a include copper, solder, gold or nickel. In some embodiments, other appropriate materials for the electrodes (for example, 22a, 22b, 22c and 22d) are also applicable in the present invention. In some embodiments, the adjacent electrodes, for example, the electrode 22a and the electrode 22b, of the first active component 14a have a spacing "S" which is greater than or equal to about 70 μm. In some embodiments, other appropriate dimensions of the spacing "S" between the adjacent electrodes are also applicable in the present invention. In some embodiments, the electrodes (for example, 22a, 22b, 22c and 22d) of the first active component 14a have a height "H" which is greater than or equal to about 40 μm. In some embodiments, other appropriate dimensions of the height "H" of the electrodes (for example, 22a, 22b, 22c and 22d) are also applicable in the present invention. In some embodiments, the electrodes (for example, 22a, 22b, 22c and 22d) of the first active component 14a have a diameter "D" which is greater than or equal to about 90 μm. In some embodiments, other appropriate dimensions of the diameter "D" of the electrodes (for example, 22a, 22b, 22c and 22d) are also applicable in the present invention.

In FIGS. 1 and 2, the package structure 10 further includes a passive component 26 disposed on the first surface 12' of the substrate 12 and connected to the electrodes (for example, 28a and 28b) of the substrate 12. In addition, the package structure 10 further includes a drive integrated circuit 30 disposed on the first surface 12' of the substrate 12 and connected to the electrodes (for example, 32a, 32b, 32c, 32d, 32e, 32f, 32g, 32h, 32i, 32j and 32k) of the substrate 12. In some embodiments, the passive component 26 and the drive integrated circuit 30 are respectively connected to the electrodes (for example, 28a and 28b) and the electrodes (for example, 32a, 32b, 32c, 32d, 32e, 32f, 32g, 32h, 32i, 32j and 32k) of the substrate 12 by the surface mount technology (SMT).

Figure 5:
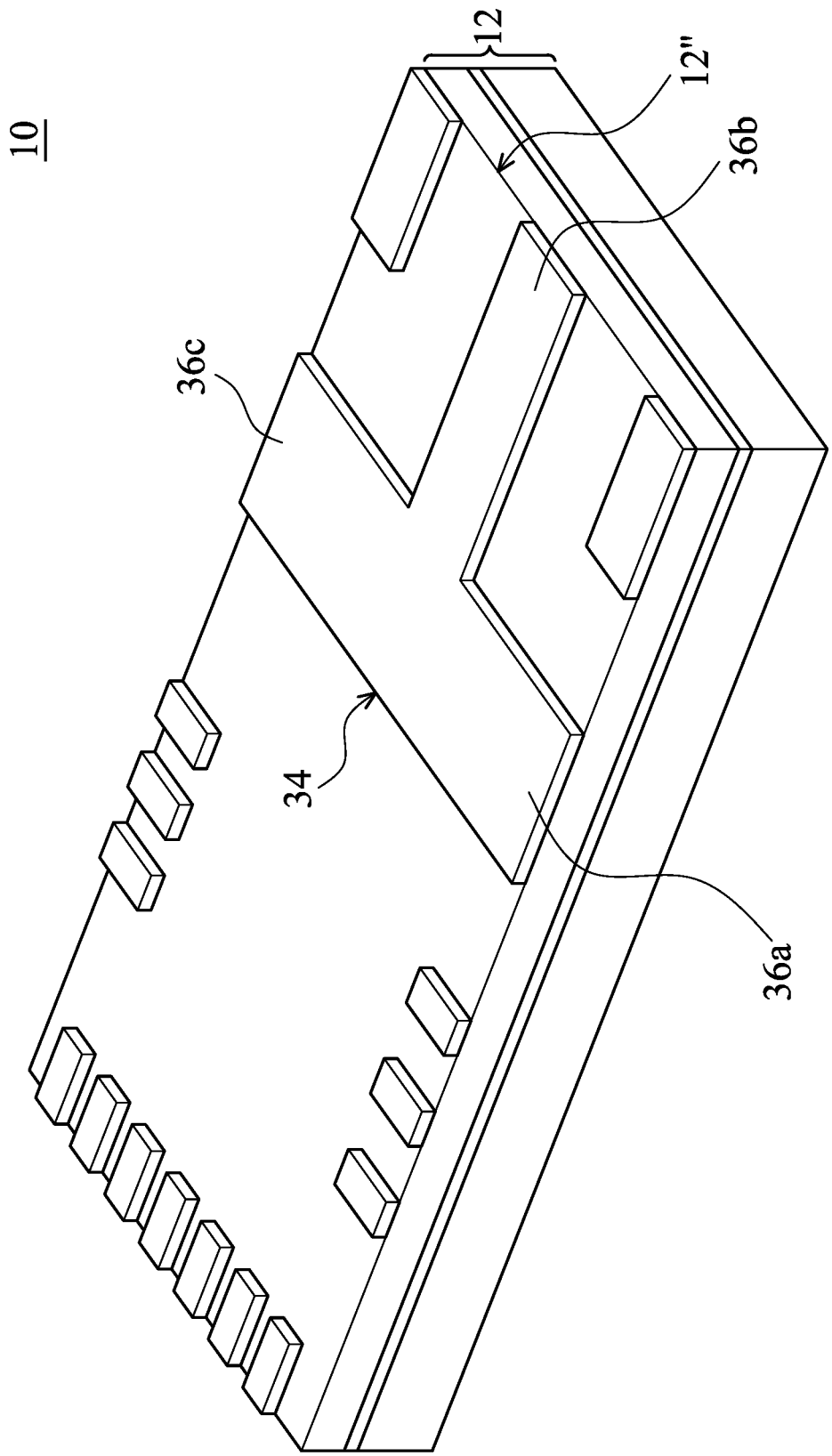
FIG. 5 is a stereoscopic view of a package structure in accordance with one embodiment of the invention.

Referring to FIG. 5, the package structure 10 further includes a metal pad 34 disposed on the second surface 12" of the substrate 12 and located at a position corresponding to the active components (not shown). In FIG. 5, the metal pad 34 has a T shape and includes three connection ports (36a, 36b and 36c) for connecting to external circuits. In some embodiments, the area occupied by the metal pad 34 on the second surface 12" of the substrate 12 is not particularly limited, and is maximized as much as possible. In some embodiments, the metal pad 34 includes solder, aluminum, silver, gold or copper. In some embodiments, other appropriate metal materials are also applicable in the present invention. In some embodiments, the package structure 10 is connected to a printed circuit board (not shown) by the metal pad 34. In some embodiments, a heat sink (not shown) is further disposed above the first metal part 16a and the second metal part 16b to promote heat conduction.

In FIG. 3, the package structure 10 has a thickness "$T_{PS}$" which is less than or equal to about 3 mm. The package structure 10 has a volume which is less than or equal to about 350 mm³. In addition, as shown in FIG. 1, since a number of integrated circuit components, for example, at least two active components (i.e. the first active component 14a and the second active component 14b), at least one passive component (i.e. the passive component 26) and the drive integrated circuit 30, are enclosed in the same package unit, the package structure 10 is regarded as a system in package (SIP). In the package structure 10, considering that it does not affect the heat dissipation of the metal parts and safety regulations, the distance "$D_A$" between any two active components (for example, the first active component 14a and the second active component 14b) is controlled to be greater than or equal to 2 mm, for example, in a range from about 2 mm to about 5 mm. In addition, while the substrate 12 is a rectangle having a long side "L" and a short side "W", the active components (for example, the first active component 14a and the second active component 14b) are arranged along the short side "W" of the substrate 12, as shown in FIGS. 1 and 2. In some embodiments, the active components (for example, the first active component 14a and the second active component 14b) are arranged along the long side "L" of the substrate 12.

Figure 6:
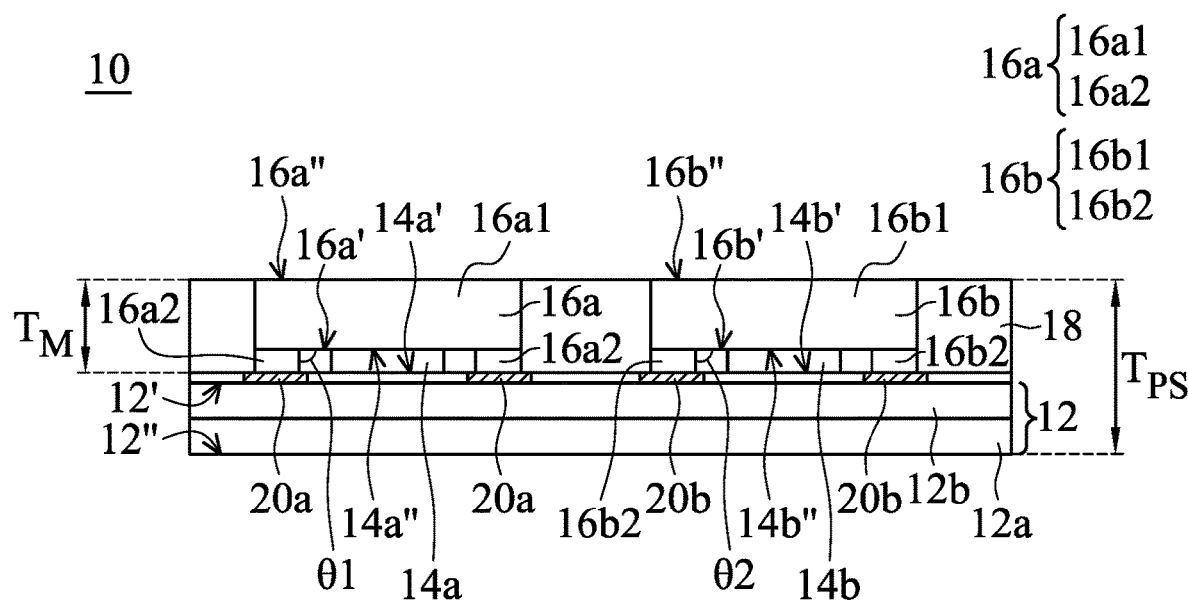
FIG. 6 is a cross-sectional view of a package structure in accordance with one embodiment of the invention.

Referring to FIGS. 1, 2 and 6, in accordance with one embodiment of the invention, a package structure 10 is provided. FIG. 1 is an exploded view of the package structure 10. FIG. 2 is a top view of the package structure 10. FIG. 6 is a cross-sectional view of the package structure 10, taken along a cross-sectional line A-A' of FIG. 2.

As shown in FIGS. 1, 2 and 6, the package structure 10 includes a substrate 12, a first active component 14a, a second active component 14b, a first metal part 16a, a second metal part 16b and an encapsulation material 18. The substrate 12 has a first surface 12' and a second surface 12" opposite the first surface 12'. The first active component 14a has a first surface 14a' and a second surface 14a" opposite the first surface 14a'. The second active component 14b has a first surface 14b' and a second surface 14b" opposite the first surface 14b'. The first metal part 16a has a first surface 16a' and a second surface 16a" opposite the first surface 16a'. The second metal part 16b has a first surface 16b' and a second surface 16b" opposite the first surface 16b'. The first surface 14a' of the first active component 14a and the first surface 14b' of the second active component 14b are respectively connected to the first surface 12' of the substrate 12. The first surface 16a' of the first metal part 16a is connected to the second surface 14a" of the first active component 14a. The first surface 16b' of the second metal part 16b is connected to the second surface 14b" of the second active component 14b. The first metal part 16a and the second metal part 16b respectively extend to connect to the first surface 12' of the substrate 12. The encapsulation material 18 covers the first surface 12' of the substrate 12 and surrounds the first active component 14a, the second active component 14b, the first metal part 16a and the second metal part 16b. The second surface 16a" of the first metal part 16a, the second surface 16b" of the second metal part 16b, and the second surface 12" of the substrate 12 are exposed from the encapsulation material 18.

In some embodiments, the substrate 12 includes multiple circuit layers (i.e. at least two circuit layers). For example, as shown in FIG. 6, the substrate 12 includes two circuit layers, that is, a first circuit layer 12a and a second circuit layer 12b. The second circuit layer 12b is disposed on the first circuit layer 12a. In accordance with the requirements of the products, other appropriate numbers of circuit layers, for example, three circuit layers or four circuit layers or more, are also applicable in the present invention. Various circuit layers provide different functions. For example, as shown in FIG. 6, the second circuit layer 12b provides a specific circuit layout for the components disposed thereon. The first circuit layer 12a facilitates the connection between the package structure 10 and the underlying PCB.

In some embodiments, the first active component 14a and the second active component 14b include, for example, gallium nitride (GaN) active components. In some embodiments, the active components with other appropriate materials, for example, silicon carbide (SiC), are also applicable in the present invention. In some embodiments, the first active component 14a and the second active component 14b include lateral power components, for example, lateral high-power components.

In some embodiments, the first metal part 16a and the second metal part 16b include, for example, copper, iron or aluminum. In some embodiments, other appropriate heat-dissipation metal materials are also applicable in the present invention. In FIG. 6, the first metal part 16a includes one main portion 16a1 and four extending portions 16a2 connected to the main portion 16a1. The four extending portions 16a2 respectively extend from the four sides of the main portion 16a1. The main portion 16a1 is disposed on the second surface 14a" of the first active component 14a. The four extending portions 16a2 are respectively connected to the electrodes 20a of the substrate 12. Also, the second metal part 16b includes one main portion 16b1 and four extending portions 16b2 connected to the main portion 16b1. The four extending portions 16b2 respectively extend from the four sides of the main portion 16b1. The main portion 16b1 is disposed on the second surface 14b" of the second active component 14b. The four extending portions 16b2 are respectively connected to the electrodes 20b of the substrate 12. In some embodiments, the number of the extending portion of the metal part is not limited thereto, and other appropriate numbers of the extending portions of the metal part are also applicable in the present invention. In some embodiments, in the first metal part 16a, the main portion 16a1 and the extending portion 16a2 have a first included angle "θ1" which is in a range from about 85 degrees to about 145 degrees therebetween. In some embodiments, the first included angle "θ1" between the main portion 16a1 and the extending portion 16a2 of the first metal part 16a is close to 90 degrees. In some embodiments, in the second metal part 16b, the main portion 16b1 and the extending portion 16b2 have a second included angle "θ2" which is in a range from about 85 degrees to about 145 degrees therebetween. In some embodiments, the second included angle "θ2" between the main portion 16b1 and the extending portion 16b2 of the second metal part 16b is close to 90 degrees. In some embodiments, the first included angle "θ1" and the second included angle "θ2" are the same or different. In some embodiments, the first metal part 16a and the second metal part 16b have a thickness "$T_M$" which is in a range from about 500 μm to about 800 μm. In some embodiments, other appropriate dimensions of the thickness "$T_M$" of the first metal part 16a and the second metal part 16b are also applicable in the present invention. As shown in FIG. 6, the first metal part 16a is separated from the second metal part 16b, that is, one metal part corresponds to (attached on) one active component, for example, the first metal part 16a corresponds to (attached on) the first active component 14a, and the second metal part 16b corresponds to (attached on) the second active component 14b.

The detailed connection profile between the first and second active components (14a and 14b) and the substrate 12 is revealed. The connection profile between the first active component 14a and the substrate 12 is exemplary, as shown in FIG. 4. FIG. 4 is a cross-sectional view of a part of the package structure 10. The first active component 14a includes a plurality of electrodes (for example, 22a, 22b, 22c and 22d) disposed on the first surface 14a' of the first active component 14a. In some embodiments, the electrodes (for example, 22a, 22b, 22c and 22d) include a source electrode, a drain electrode, a gate electrode or an auxiliary electrode. In some embodiments, the number of the electrodes is not limited thereto, and other appropriate numbers of the electrodes of the first active component 14a are also applicable in the present invention. In some embodiments, the electrodes are arranged in an array (not shown) or around the peripheral area of the first active component 14a. In FIG. 4, the electrodes (for example, 22a, 22b, 22c and 22d) are laterally disposed on the first surface 14a' of the first active component 14a (i.e. disposition on the same plane). Therefore, the first active component 14a is a lateral power component. The substrate 12 includes a plurality of electrodes (pads) (for example, 24a, 24b, 24c and 24d) disposed on the first surface 12' of the substrate 12 and having different electric potential, for example, high or low electric potential. In FIG. 4, the electrodes (for example, 22a, 22b, 22c and 22d) of the first active component 14a are directly connected to the respective electrodes (pads) (for example, 24a, 24b, 24c and 24d) of the substrate 12, that is, the present invention uses flip chip technology to attach the reverse first active component 14a to the substrate 12. The electrodes (for example, 22a, 22b, 22c and 22d) of the first active component 14a are connected to the corresponding electrodes (pads) (for example, 24a, 24b, 24c and 24d) of the substrate 12.

In FIG. 4, the electrodes (for example, 22a, 22b, 22c and 22d) of the first active component 14a have a shape of cylinder. In some embodiments, the electrodes (for example, 22a, 22b, 22c and 22d) may have another appropriate shape, such as the shape of sphere, and this is also applicable in the present invention. In some embodiments, the electrodes (for example, 22a, 22b, 22c and 22d) of the first active component 14a include copper, solder, gold or nickel. In some embodiments, other appropriate materials for the electrodes (for example, 22a, 22b, 22c and 22d) are also applicable in the present invention. In some embodiments, the adjacent electrodes, for example, the electrode 22a and the electrode 22b, of the first active component 14a have a spacing "S" which is greater than or equal to about 70 µm. In some embodiments, other appropriate dimensions of the spacing "S" between the adjacent electrodes are also applicable in the present invention. In some embodiments, the electrodes (for example, 22a, 22b, 22c and 22d) of the first active component 14a have a height "H" which is greater than or equal to about 40 µm. In some embodiments, other appropriate dimensions of the height "H" of the electrodes (for example, 22a, 22b, 22c and 22d) are also applicable in the present invention. In some embodiments, the electrodes (for example, 22a, 22b, 22c and 22d) of the first active component 14a have a diameter "D" which is greater than or equal to about 90 µm. In some embodiments, other appropriate dimensions of the diameter "D" of the electrodes (for example, 22a, 22b, 22c and 22d) are also applicable in the present invention.

In FIGS. 1 and 2, the package structure 10 further includes a passive component 26 disposed on the first surface 12' of the substrate 12 and connected to the electrodes (for example, 28a and 28b) of the substrate 12. In addition, the package structure 10 further includes a drive integrated circuit 30 disposed on the first surface 12' of the substrate 12 and connected to the electrodes (for example, 32a, 32b, 32c, 32d, 32e, 32f, 32g, 32h, 32i, 32j and 32k) of the substrate 12. In some embodiments, the passive component 26 and the drive integrated circuit 30 are respectively connected to the electrodes (for example, 28a and 28b) and the electrodes (for example, 32a, 32b, 32c, 32d, 32e, 32f, 32g, 32h, 32i, 32j and 32k) of the substrate 12 by the surface mount technology (SMT).

Referring to FIG. 5, the package structure 10 further includes a metal pad 34 disposed on the second surface 12" of the substrate 12 and located at a position corresponding to the active components (not shown). In FIG. 5, the metal pad 34 has a T shape and includes three connection ports (36a, 36b and 36c) for connecting to external circuits. In some embodiments, the area occupied by the metal pad 34 on the second surface 12" of the substrate 12 is not particularly limited, and is maximized as much as possible. In some embodiments, the metal pad 34 includes solder, aluminum, silver, gold or copper. In some embodiments, other appropriate metal materials are also applicable in the present invention. In some embodiments, the package structure 10 is connected to a printed circuit board (not shown) by the metal pad 34. In some embodiments, a heat sink (not shown) is further disposed above the first metal part 16a and the second metal part 16b to promote heat conduction.

In FIG. 6, the package structure 10 has a thickness "$T_{PS}$" which is less than or equal to about 3 mm. The package structure 10 has a volume which is less than or equal to about 350 mm$^3$. In addition, as shown in FIG. 1, since a number of integrated circuit components, for example, at least two active components (i.e. the first active component 14a and the second active component 14b), at least one passive component (i.e. the passive component 26) and the drive integrated circuit 30, are enclosed in the same package unit, the package structure 10 is regarded as a system in package (SIP). In the package structure 10, considering that it does not affect the heat dissipation of the metal parts and safety regulations, the distance "$D_A$" between any two active components (for example, the first active component 14a and the second active component 14b) is controlled to be greater than or equal to 2 mm, for example, in a range from about 2 mm to about 5 mm. In addition, while the substrate 12 is a rectangle having a long side "L" and a short side "W", the active components (for example, the first active component 14a and the second active component 14b) are arranged along the short side "W" of the substrate 12, as shown in FIGS. 1 and 2. In some embodiments, the active components (for example, the first active component 14a and the second active component 14b) are arranged along the long side "L" of the substrate 12.

The present invention uses flip chip technology to attach the reverse active components to the substrate. Since the electrodes of the active components are directly connected to the electrodes of the substrate instead of the conventional wire bonding process, the heat dissipation path is shortened and the inductance is lowered, further reducing conduction loss and switching loss. Due to the elimination of the wire bonding process, the active components occupy a relatively-small area of the substrate, which is suitable for miniaturization. In addition to the flip chip technology which promotes heat dissipation towards the substrate, the metal parts disposed on the opposite side of the electrodes of the active components also provides another heat dissipation path so that the present package structure achieves an effect of double-sided heat dissipation. Since the electrodes of the active components have an appropriate height (greater than or equal to about 40 µm), a suitable space is created between the active components and the substrate for improving the active components to endure high breakdown voltage and facilitating the mold flowing of the encapsulation material. Furthermore, the electrode (pad) (similar to T shape) disposed on the backside of the substrate includes three connection ports for connecting to external circuits. In addition to increasing flexibilities of circuit design, it also increases heat dissipation and reduces inductance. Since a number of integrated circuit components, for example, at least two active components, at least one passive component and one drive integrated circuit, are enclosed in the same package unit, the present package structure is regarded as a system in package (SIP).

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure, comprising:
    a substrate having a first surface and a second surface opposite the first surface;
    a plurality of gallium nitride (GaN) active components, each gallium nitride (GaN) active component having a first surface and a second surface opposite the first surface, wherein the first surface of each gallium nitride (GaN) active component is connected to the first surface of the substrate;
    a plurality of separated metal parts, each metal part having a first surface and a second surface opposite the first surface, wherein the first surface of one metal part is connected to the second surface of one gallium nitride (GaN) active component, and each metal part extends to connect to the first surface of the substrate; and an encapsulation material covering the first surface of the substrate and surrounding the gallium nitride (GaN) active components and the metal parts, and exposing the second surface of the substrate.

2. The package structure as claimed in claim 1, wherein the substrate comprises multiple circuit layers.

3. The package structure as claimed in claim 1, wherein the second surface of each metal part is exposed from the encapsulation material.

4. The package structure as claimed in claim 1, wherein the metal part comprises copper, iron or aluminum.

5. The package structure as claimed in claim 1, wherein each gallium nitride (GaN) active component further comprises a plurality of electrodes disposed on the first surface of the gallium nitride (GaN) active component.

6. The package structure as claimed in claim 5, wherein the substrate further comprises a plurality of electrodes disposed on the first surface of the substrate.

7. The package structure as claimed in claim 6, wherein the electrodes of each gallium nitride (GaN) active component are respectively connected to the electrodes of the substrate.

8. The package structure as claimed in claim 5, wherein the electrode of the gallium nitride (GaN) active component has a shape of cylinder or sphere.

9. The package structure as claimed in claim 5, wherein the electrode of the gallium nitride (GaN) active component comprises copper, solder, gold or nickel.

10. The package structure as claimed in claim 5, wherein the adjacent electrodes of each gallium nitride (GaN) active component have a spacing which is greater than or equal to 70 μm.

11. The package structure as claimed in claim 5, wherein the electrode of the gallium nitride (GaN) active component has a height which is greater than or equal to 40 μm.

12. The package structure as claimed in claim 5, wherein the electrode of the gallium nitride (GaN) active component has a diameter which is greater than or equal to 90 μm.

13. The package structure as claimed in claim 6, wherein each metal part comprises a main portion and at least one extending portion connected to the main portion, the main portion is disposed on the second surface of the gallium nitride (GaN) active component, and the at least one extending portion is connected to the electrode of the substrate.

14. The package structure as claimed in claim 1, further comprising at least one passive component disposed on the first surface of the substrate and connected to the electrode of the substrate.

15. The package structure as claimed in claim 1, further comprising a drive integrated circuit disposed on the first surface of the substrate and connected to the electrode of the substrate.

16. The package structure as claimed in claim 1, further comprising a metal pad disposed on the second surface of the substrate and located at a position corresponding to the gallium nitride (GaN) active components.

17. The package structure as claimed in claim 16, wherein the metal pad comprises three connection ports for connecting to external circuits.

18. The package structure as claimed in claim 16, wherein the metal pad comprises solder, aluminum, silver, gold or copper.

19. The package structure as claimed in claim 16, wherein the package structure is connected to a printed circuit board by the metal pad.

20. The package structure as claimed in claim 1, wherein the package structure has a thickness which is less than or equal to 3 mm.

* * * * *